United States Patent
Kwon et al.

(10) Patent No.: US 8,866,060 B2
(45) Date of Patent: Oct. 21, 2014

(54) TEMPERATURE SENSOR AND IMAGE SENSOR HAVING THE SAME

(75) Inventors: Min-Ho Kwon, Seoul (KR); Sin-Hwan Lim, Yongin-si (KR); Jin-Ho Seo, Seoul (KR); Ju-Hyun Ko, Seongnam-si (KR); Young-Tae Jang, Pyeongtaek-si (KR); Kyo-Jin Choo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 402 days.

(21) Appl. No.: 13/243,471

(22) Filed: Sep. 23, 2011

(65) Prior Publication Data

US 2012/0104229 A1    May 3, 2012

(30) Foreign Application Priority Data

Oct. 28, 2010    (KR) .................. 10-2010-0105781

(51) Int. Cl.
*H01L 27/00*    (2006.01)
*G01J 5/22*    (2006.01)

(52) U.S. Cl.
CPC .......................... *G01J 5/22* (2013.01)
USPC ............. 250/208.1; 250/214 R; 250/214 DC; 348/244

(58) Field of Classification Search
USPC ............... 250/208.1, 214 R, 214 DC, 214 C; 327/512, 513; 348/222.1, 241, 244, 348/308, E5.091
See application file for complete search history.

(56) References Cited

U.S. PATENT DOCUMENTS

| | | | |
|---|---|---|---|
| 6,949,968 B1 | 9/2005 | Mulligan | |
| 7,280,139 B2 * | 10/2007 | Pahr et al. | 348/241 |
| 2008/0158378 A1 * | 7/2008 | Lee | 348/222.1 |

FOREIGN PATENT DOCUMENTS

| | | |
|---|---|---|
| JP | 2004-356866 A | 12/2004 |
| JP | 2006-134529 A | 5/2006 |
| JP | 2009-069023 A | 4/2009 |

* cited by examiner

*Primary Examiner* — Kevin Pyo
(74) *Attorney, Agent, or Firm* — Lee & Morse, P.C.

(57) ABSTRACT

A temperature sensor includes a band gap reference (BGR) circuit, a voltage generation unit and a digital CDS circuit. The band gap reference (BGR) circuit generates a reference voltage proportional to a temperature. The voltage generation unit generates a first voltage and a second voltage based on the reference voltage, where the first voltage and the second voltage are proportional to the temperature. The digital CDS circuit generates a digital signal corresponding to the temperature by performing a digital correlated double sampling (CDS) operation on the first voltage and the second voltage. The temperature sensor is able to detect a temperature accurately.

11 Claims, 10 Drawing Sheets

| DS2 | TEMPERATURE(°C) |
|-----|-----------------|
| 220 | −40 |
| 221 | −39 |
| 222 | −38 |
| ⋮ | ⋮ |
| 380 | 120 |

FIG. 14

TEMPERATURE SENSOR AND IMAGE SENSOR HAVING THE SAME

CROSS-REFERENCE TO RELATED APPLICATION

Korean Patent Application No. 10-2010-0105781, filed on Oct. 28, 2010, in the Korean Intellectual Property Office, and entitled: "Temperature Sensor and Image Sensor Having the Same," is incorporated by reference herein in its entirety.

BACKGROUND

1. Technical Field

Example embodiments relate to a temperature sensor, and more particularly to a temperature sensor that is able to detect a temperature accurately and an image sensing device including the temperature sensor.

2. Description of the Related Art

Various devices are used to measure a physical quantity, such as light intensity, sound intensity, etc., and generate an electrical signal corresponding to the measured physical quantity. Generally, those devices use a semiconductor element, such as a transistor. Therefore, a magnitude of the electrical signal generated by those devices for the same physical quantity varies according to a temperature.

For example, an image sensor, which captures an image based on characteristics of a semiconductor responding to an incident light intensity, responses differently according to a temperature. Therefore, an output image generated by the image sensor for the same subject varies according to a temperature.

SUMMARY

One or more embodiments provide a temperature sensor that is adapted to accurately detect a temperature.

One or more embodiments provide an image sensor that is adapted to calibrate a change of temperature using a temperature sensor that is adapted to accurately detect a temperature.

One or more embodiments provide a temperature sensor, including a band gap reference (BGR) circuit configured to generate a reference voltage proportional to a temperature, a voltage generation unit configured to generate a first voltage and a second voltage based on the reference voltage, the first voltage and the second voltage being proportional to the temperature, and a digital CDS circuit configured to generate a digital signal corresponding to the temperature by performing a digital correlated double sampling (CDS) operation on the first voltage and the second voltage.

The voltage generation unit may adjust a magnitude of the first voltage and a magnitude of the second voltage in a same ratio based on a gain control signal.

The voltage generation unit may include a voltage-current conversion unit configured to generate a reference current based on the reference voltage, the reference current being proportional to the reference voltage, the voltage-current conversion unit adjusting a magnitude of the reference current in response to a gain control signal, a current-voltage conversion unit configured to generate the first voltage and the second voltage based on the reference current, the first voltage and the second voltage being proportional to the reference current, and a multiplexer configured to output one of the first voltage and the second voltage in response to a switch control signal.

The voltage-current conversion may include a plurality of voltage-current converters coupled in parallel between a supply voltage and the current-voltage conversion unit, each of the plurality of the voltage-current converters being turned on in response to the gain control signal to generate a respective current proportional to the reference voltage.

Each of the plurality of the voltage-current converters may include a p-type metal oxide semiconductor (PMOS) transistor having a drain, a source connected to the supply voltage, and a gate receiving the reference voltage, and a switch coupled between the drain of the PMOS transistor and the current-voltage conversion unit, the switch being turned on or turned off in response to the gain control signal.

The current-voltage conversion unit may include a first resistor coupled between a first node and a second node, the first resistor being connected to the voltage-current conversion unit at the first node, the first resistor receiving the reference current from the voltage-current conversion unit at the first node, and a second resistor coupled between the second node and a ground voltage, wherein the current-voltage conversion unit outputs the first voltage at the first node and outputs the second voltage at the second node.

One or more embodiments provide an image sensor, including a detection unit configured to generate a first analog signal corresponding to a reset component after reset, and configured to measure an intensity of incident light to generate a second analog signal corresponding to the measured intensity of incident light, a temperature sensing unit configured to generate a first voltage and a second voltage proportional to a temperature, an analog-digital conversion unit configured to generate a first digital signal corresponding to an effective intensity of incident light among the measured intensity of incident light by performing a digital CDS operation on the first analog signal and the second analog signal, and configured to generate a second digital signal corresponding to the temperature by performing a digital CDS operation on the first voltage and the second voltage, and a digital signal processor (DSP) configured to adjust the first digital signal based on the second digital signal.

The detection unit may include a pixel array having a plurality of pixels arranged in rows and columns, each pixel generating the first analog signal corresponding to a respective reset component and measuring the intensity of incident light to generate the second analog signal corresponding to a respective measured intensity of incident light.

The analog-digital conversion unit may generate the first digital signals corresponding to a row of the pixel array and the second digital signal simultaneously.

The analog-digital conversion unit may include a plurality of first digital CDS circuits coupled to columns of the pixel array, respectively, each of the plurality of the first digital CDS circuits generating the first digital signal by performing a digital CDS operation on the first analog signal and the second analog signal, and a second digital CDS circuit coupled to the temperature sensing unit, the second digital CDS circuit generating the second digital signal by performing a digital CDS operation on the first voltage and the second voltage.

The analog-digital conversion unit may generate the first digital signals corresponding to all rows of the pixel array in a first operation mode, and generates the second digital signal in a second operation mode.

The analog-digital conversion unit may include a first digital CDS circuit coupled to both a first column of the pixel array and the temperature sensing unit, and a plurality of second digital CDS circuits coupled to columns except for the first column of the pixel array, respectively, wherein the first digital CDS circuit and each of the plurality of the second digital CDS circuits may generate the first digital signal by performing a digital CDS operation on the first analog signal and the second analog signal in the first operation mode, and the first digital CDS circuit generates the second digital signal by performing a digital CDS operation on the first voltage and the second voltage in the second operation mode.

The digital signal processor may include a look-up table for matching the second digital signal with temperature, and reads a temperature corresponding to a value of the second digital signal from the look-up table.

The digital signal processor may adjust the first digital signal based on the read temperature.

The image sensor may include a control unit configured to provide a ramp signal, which is used by the analog-digital conversion unit for performing a digital CDS operation on the first analog signal and the second analog signal to generate the first digital signal, to the analog-digital conversion unit, wherein the digital signal processor may provide a feedback control signal to the control unit based on the read temperature, and the control unit adjusts a magnitude of the ramp signal based on the feedback control signal.

The image sensor may include a control unit configured to provide a control signal to the pixel array to control an operation of the pixel array, wherein the digital signal processor provides a feedback control signal to the control unit based on the read temperature, and the control unit adjusts a voltage of the control signal based on the feedback control signal.

One or more embodiments provide a detection device, including a temperature detector configured to detect a temperature and to generate first and second signals proportional to the temperature, an analog-digital converter configured to generate a first digital signal by performing correlated double sampling (CDS) on the first and second signals from the temperature detector, and a processor configured to process an intensity signal based on the first digital signal, the intensity signal corresponding to an intensity of incident light and/or sound detected by the detection device.

The detection device may include a detector configured to detect the intensity of at least one of incident light and sound and to generate a first analog signal corresponding to a reset component and a second analog signal corresponding to a detected intensity, wherein the analog-digital converter is configured to generate a second digital signal, corresponding to the intensity signal, by performing CDS on the first and second analog signals from the detector, and the digital signal processor is configured to process the second digital signal based on the first digital signal.

The temperature sensor may include a voltage generating unit and the first and second signals generated by the temperature sensor correspond to a first voltage and a second voltage, respectively.

The temperature sensor may include a band gap reference circuit configured to generate a reference voltage proportional to the temperature, wherein the voltage generating unit is configured to generate the first voltage and the second voltage based on the reference voltage.

BRIEF DESCRIPTION OF THE DRAWINGS

Features will become more apparent to those of ordinary skill in the art by describing in detail exemplary embodiments with reference to the attached drawings, in which.

DETAILED DESCRIPTION OF THE EMBODIMENTS

Various example embodiments will be described more fully with reference to the accompanying drawings, in which some example embodiments are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
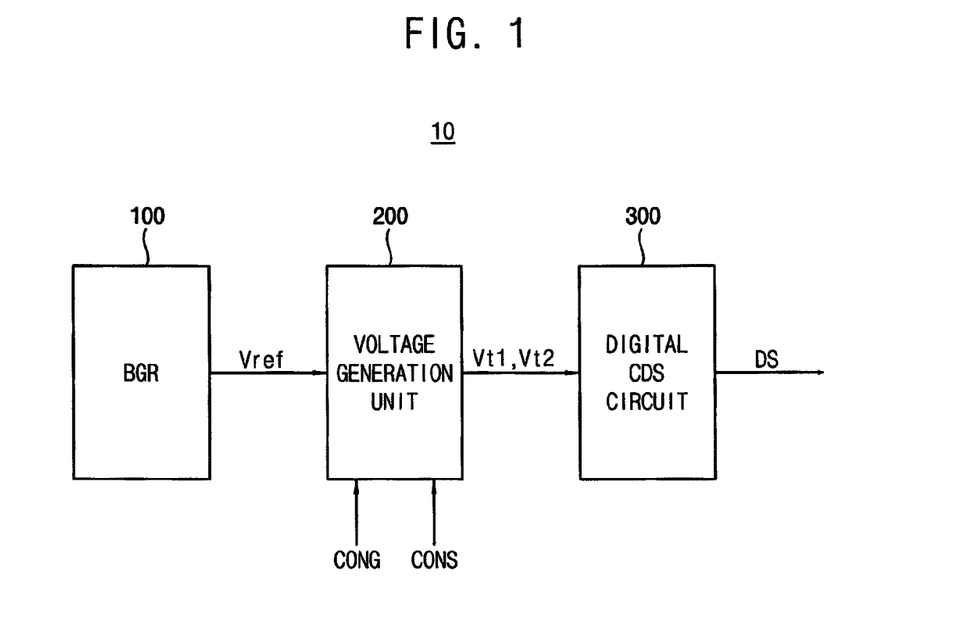
FIG. 1 illustrates a block diagram of an exemplary embodiment of a temperature sensor.

FIG. 1 illustrates a block diagram of an exemplary embodiment of a temperature sensor 10.

Referring to FIG. 1, the temperature sensor 10 may include a band gap reference (BGR) circuit 100, a voltage generation unit 200, and a digital CDS circuit 300.

The band gap reference circuit 100 may generate a reference voltage Vref proportional to a temperature of the temperature sensor 10. For example, the band gap reference circuit 100 may generate the reference voltage Vref linearly proportional to an absolute temperature.

The voltage generation unit 200 may generate a first voltage Vt1 and a second voltage Vt2 based on the reference voltage Vref received from the band gap reference circuit 100. The first voltage Vt1 and the second voltage Vt2 may be proportional to the temperature. The voltage generation unit 200 may adjust a magnitude of the first voltage Vt1 and a magnitude of the second voltage Vt2 in a same ratio based on a gain control signal CONG. The voltage generation unit 200 may output one of the first voltage Vt1 and the second voltage Vt2 in response to a switch control signal CONS.

The digital CDS circuit 300 may generate a digital signal DS corresponding to the temperature by performing a digital correlated double sampling (CDS) operation on the first voltage Vt1 and the second voltage Vt2 received from the voltage generation unit 200. In this application, a digital CDS operation represents converting two analog signals into two digital signals, respectively, and then outputting a difference between the two digital signals.

Figure 2:
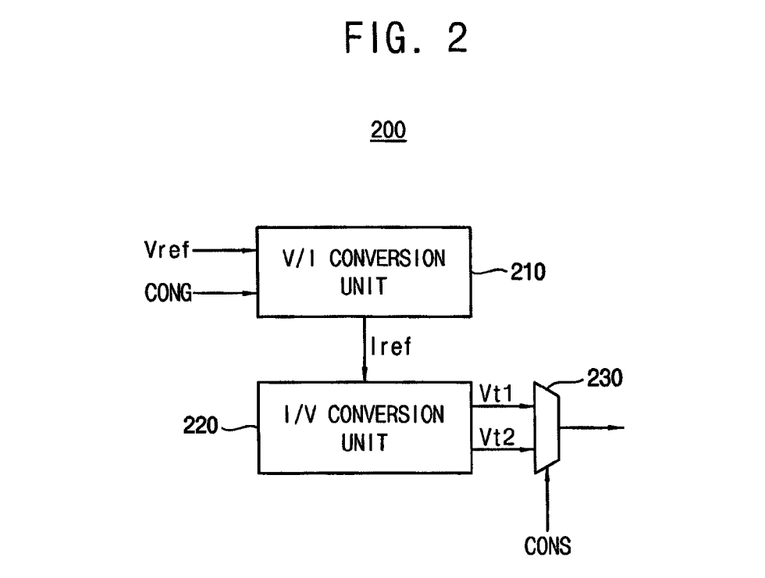
FIG. 2 illustrates a block diagram of an exemplary embodiment of the voltage generation unit employable in a temperature sensor of FIG. 1.

FIG. 2 illustrates a block diagram of an exemplary embodiment of the voltage generation unit 200 employable in the temperature sensor 10 of FIG. 1

Referring to FIG. 2, the voltage generation unit 200 may include a voltage-current conversion unit 210, a current-voltage conversion unit 220, and a multiplexer 230.

The voltage-current conversion unit 210 may generate a reference current Iref based on the reference voltage Vref received from the band gap reference circuit 100. The reference current Iref may be proportional to the reference voltage Vref. The voltage-current conversion unit 210 may adjust a magnitude of the reference current Iref in response to the gain control signal CONG.

The current-voltage conversion unit 220 may generate the first voltage Vt1 and the second voltage Vt2 based on the reference current Iref received from the voltage-current conversion unit 210. The first voltage Vt1 and the second voltage Vt2 may be proportional to the reference current Iref.

The multiplexer 230 may output one of the first voltage Vt1 and the second voltage Vt2 in response to the switch control signal CONS.

Figure 3:
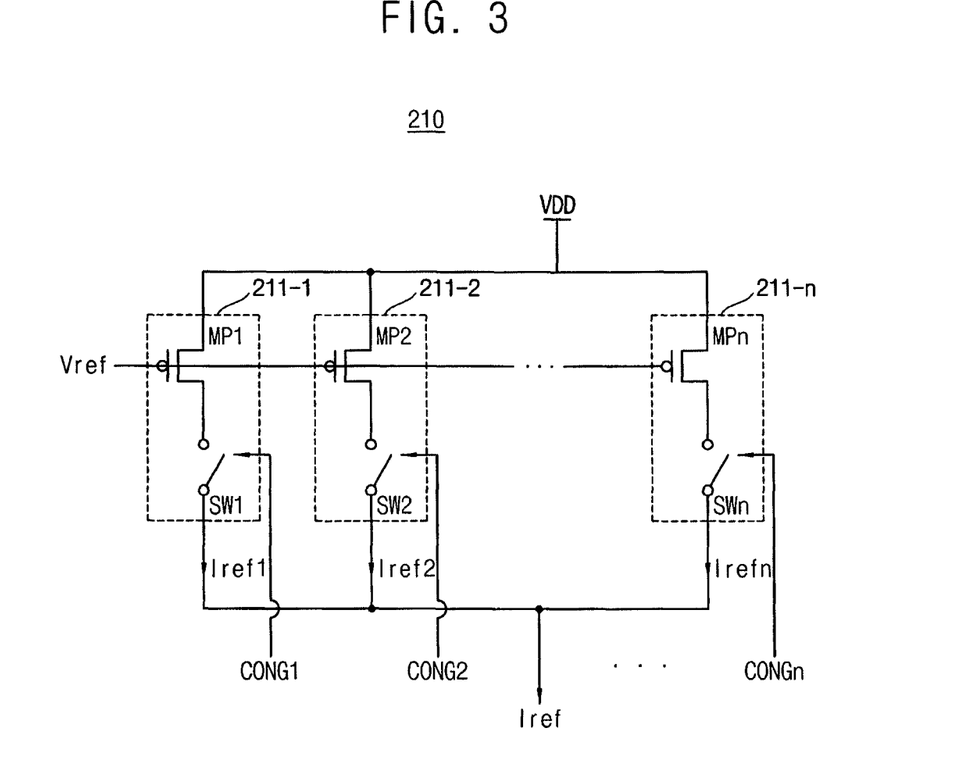
FIG. 3 illustrates a block diagram of an exemplary embodiment of a voltage-current conversion unit employable in the voltage generation unit of FIG. 2.

FIG. 3 illustrates a block diagram of an exemplary embodiment of the voltage-current conversion unit 210 employable in the voltage generation unit 200 of FIG. 2.

Referring to FIG. 3, the voltage-current conversion unit 210 may include a plurality of voltage-current converters 211-1, 211-2, ..., 211-n coupled in parallel between a supply voltage VDD and the current-voltage conversion unit 220, where n is a positive integer. The gain control signal CONG may include a plurality of bits CONG1, CONG2, ..., CONGn. Each of the plurality of the voltage-current converters 211-1, 211-2, ..., 211-n may be turned on in response to a respective bit CONG1, CONG2, ..., CONGn included in the gain control signal CONG to generate currents Iref1, Iref2, ..., Irefn, respectively. Each of the currents Iref1, Iref2, ..., Irefn may be proportional to the reference voltage Vref. The voltage-current conversion unit 210 may generate the reference current Iref by summing the currents Iref1, Iref2, ..., Irefn generated by the plurality of the voltage-current converters 211-1, 211-2, ..., 211-n.

Each of the voltage-current converters 211-i may include a p-type metal oxide semiconductor (PMOS) transistor MPi and a switch SWi, where i is a positive integer equal to or smaller than n. The PMOS transistor MPi may include a drain connected to the switch SWi, a source connected to the supply voltage VDD, and a gate receiving the reference voltage Vref. The switch SWi may be coupled between the drain of the PMOS transistor MPi and the current-voltage conversion unit 220. The switch SWi may be turned on or turned off in response to the bit CONGi included in the gain control signal CONG.

As described above, the voltage-current conversion unit 210 may adjust the magnitude of the reference current Iref by controlling the switches SW1, SW2, ..., SWn with the gain control signal CONG while keeping the reference current Iref proportional to the reference voltage Vref.

Figure 4:
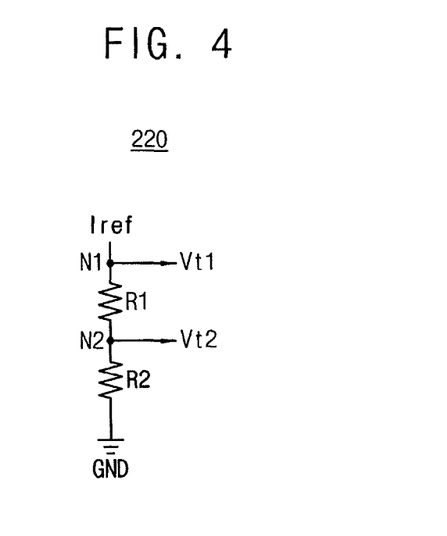
FIG. 4 illustrates a block diagram of an exemplary embodiment of a current-voltage conversion unit employable in a voltage generation unit of FIG. 2.

FIG. 4 illustrates a block diagram of an exemplary embodiment of the current-voltage conversion unit 220 employable in the voltage generation unit 200 of FIG. 2.

Referring to FIG. 4, the current-voltage conversion unit 220 may include a first resistive load R1 and a second resistive load R2. The first resistive load R1 may be coupled between a first node N1 and a second node N2, and the second resistive load R2 may be coupled between the second node N2 and a ground voltage GND. The first resistive load R1 may be connected to the voltage-current conversion unit 210 at the first node N1. The first resistive load R1 may receive the reference current Iref from the voltage-current conversion unit 210 at the first node N1. The current-voltage conversion unit 220 may output the first voltage Vt1 at the first node N1 and output the second voltage Vt2 at the second node N2.

In FIG. 4, the first resistive load R1 and the second resistive load R2 are each illustrated as a resistor. However, the first resistive load R1 and the second resistive load R2 may be any resistive load having a resistance, such as a transistor.

In one or more embodiments, the digital CDS circuit 300 may receive the first voltage Vt1 and the second voltage Vt2 from the voltage generation unit 200, and may generate the digital signal DS corresponding to a difference between the first voltage Vt1 and the second voltage Vt2 by performing a digital CDS operation on the first voltage Vt1 and the second voltage Vt2.

A conventional temperature sensor generates one voltage varying according to a temperature. Since transistors included in a temperature sensor have intrinsic nonlinear characteristics, the one voltage generated by a conventional temperature sensor is not linearly proportional to a temperature and thus, a temperature cannot be accurately determined.

In one or more embodiments, the temperature sensor 10 may generate the first voltage Vt1 and the second voltage Vt2 proportional to a temperature, and generate the digital signal DS corresponding to a difference between the first voltage Vt1 and the second voltage Vt2 by performing a digital CDS operation on the first voltage Vt1 and the second voltage Vt2. Therefore, in one or more embodiments, the temperature sensor 10 may cancel the intrinsic nonlinear characteristics of the transistors included in the temperature sensor 10 to generate the digital signal DS linearly proportional to the temperature, and determine the temperature accurately using the digital signal DS that is linearly proportional to the temperature.

FIGS. 5A to 5H illustrate graphs for describing exemplary operation of the temperature sensor 10 of FIG. 1.

In FIGS. 5A to 5H, x-axis represents a temperature of the temperature sensor 10 and y-axis represents a difference between the first voltage Vt1 and the second voltage Vt2.

Figure 5A:
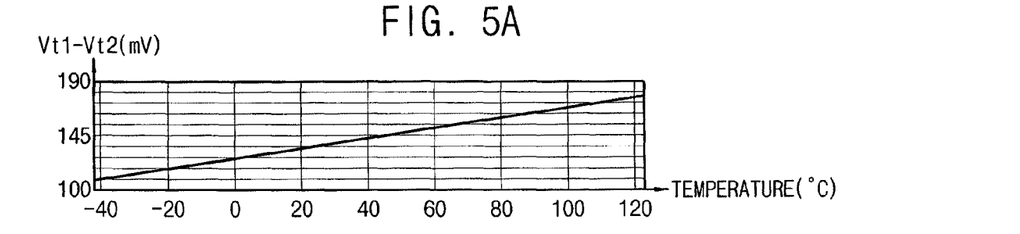
FIGS. 5A to 5H illustrate graphs for describing exemplary operation of the temperature sensor of FIG. 1.
Figure 5B:
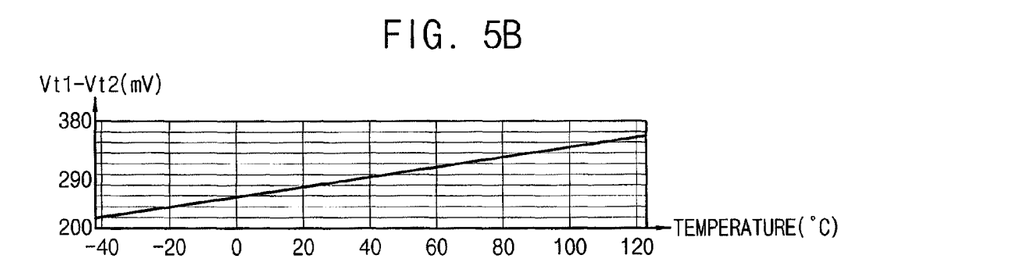
Figure 5C:
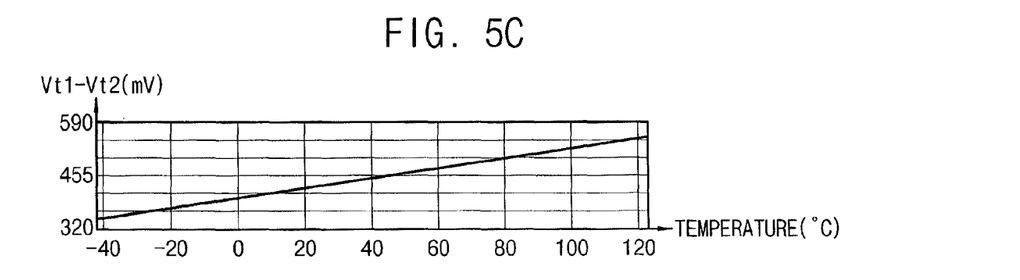
Figure 5D:
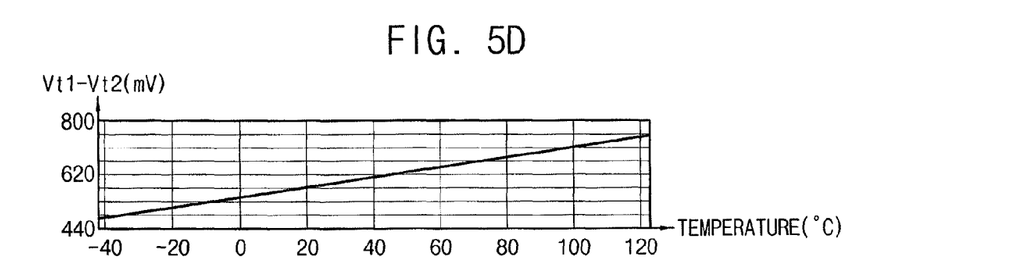
Figure 5E:
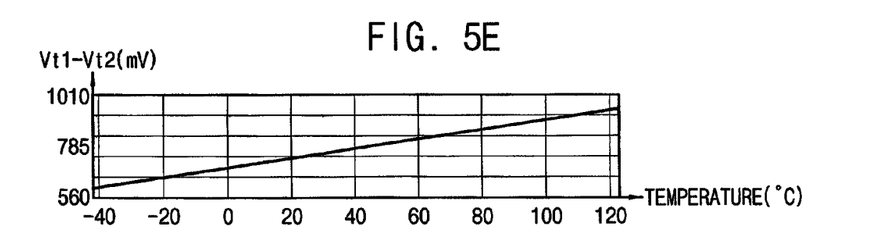
Figure 5F:
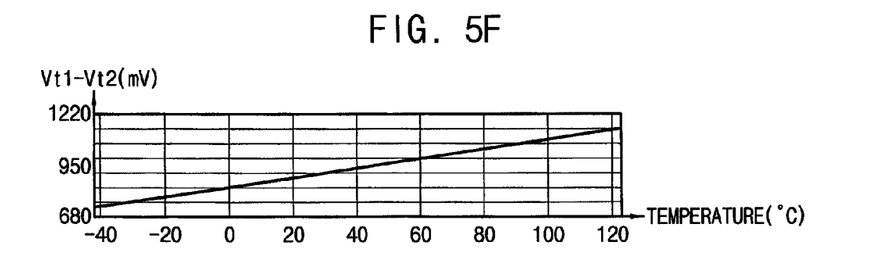
Figure 5G:
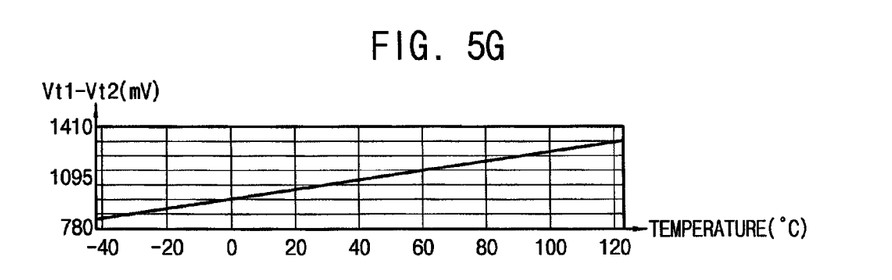
Figure 5H:
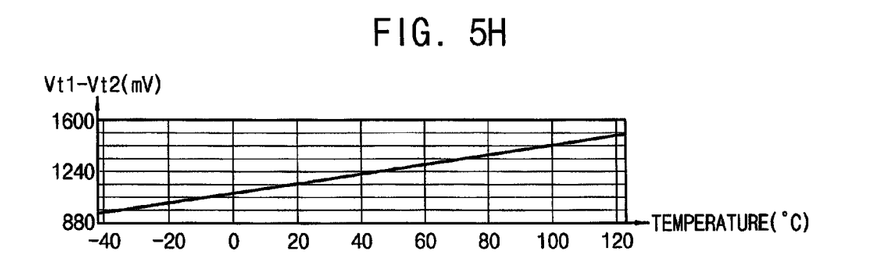

FIG. 5A illustrates a graph of an exemplary state when one of the plurality of the voltage-current converters 211-1, 211-2, . . . , 211-n included in the voltage-current conversion unit 210 are turned on. FIG. 5B illustrates a graph of an exemplary state when two of the plurality of the voltage-current converters 211-1, 211-2, . . . , 211-n included in the voltage-current conversion unit 210 are turned on. FIG. 5C illustrates a graph of a state when three of the plurality of the voltage-current converters 211-1, 211-2, . . . , 211-n included in the voltage-current conversion unit 210 are turned on. FIG. 5D illustrates a graph of a state when four of the plurality of the voltage-current converters 211-1, 211-2, . . . , 211-n included in the voltage-current conversion unit 210 are turned on. FIG. 5E illustrates a graph of a state when five of the plurality of the voltage-current converters 211-1, 211-2, . . . , 211-n included in the voltage-current conversion unit 210 are turned on. FIG. 5F illustrates a graph of a state when six of the plurality of the voltage-current converters 211-1, 211-2, . . . , 211-n included in the voltage-current conversion unit 210 are turned on. FIG. 5G illustrates a graph of a state when seven of the plurality of the voltage-current converters 211-1, 211-2, . . . , 211-n included in the voltage-current conversion unit 210 are turned on. FIG. 5H illustrates a graph of a state when eight of the plurality of the voltage-current converters 211-1, 211-2, . . . , 211-n included in the voltage-current conversion unit 210 are turned on.

As illustrated in FIGS. 5A to 5H, a difference between the first voltage Vt1 and the second voltage Vt2 is linearly proportional to the temperature. That is, a relation between the temperature and the difference between the first voltage Vt1 and the second voltage Vt2 may be represented as a first order equation. Therefore, the temperature sensor 10 may determine the temperature accurately using the digital signal DS corresponding to the difference between the first voltage Vt1 and the second voltage Vt2.

In one or more embodiments, a number of the voltage-current converters that is turned on may be determined by the gain control signal CONG. Therefore, a ratio according to which the difference between the first voltage Vt1 and the second voltage Vt2 is proportional to the temperature (that is, slopes of the graph in FIGS. 5A to 5H) may be controlled by the gain control signal CONG.

The temperature sensor 10 may be used in various devices that measure a physical quantity, such as incident light, sound, etc., and may generate an electrical signal corresponding to the measured physical quantity to calibrate the electrical signal based on a temperature.

Figure 6:
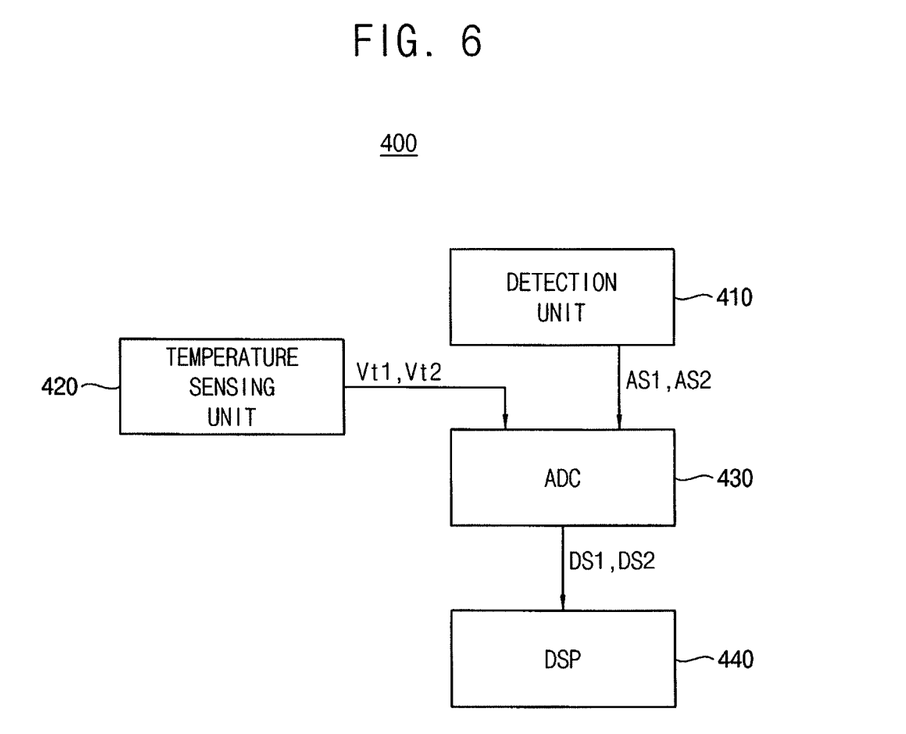
FIG. 6 illustrates a block diagram of an exemplary embodiment of a detection device.

FIG. 6 illustrates a block diagram of a detection device 400 according to example embodiments.

Referring to FIG. 6, the detection device 400 may include a detection unit 410, a temperature sensing unit 420, an analog-digital conversion unit ADC 430, and a digital signal processor DSP 440.

The detection unit 410 may reset itself and generate a first analog signal AS1 corresponding to a reset component. The detection unit 410 may measure a physical quantity, such as an intensity of incident light, an intensity of sound, etc., and may generate a second analog signal AS2 corresponding to the measured physical quantity.

The temperature sensing unit 420 may generate a first voltage Vt1 and a second voltage Vt2 proportional to a temperature of the detection device 400. The temperature sensing unit 420 may include the band gap reference circuit 100 and the voltage generation unit 200 included in the temperature sensor 10 of FIG. 1. A structure and an operation of the band gap reference circuit 100 and the voltage generation unit 200 are described above with reference to FIGS. 1, 2, 3, 4, 5A, 5B, 5C, 5D, 5E, 5F, 5G and 5H. Therefore, a detail description of the temperature sensing unit 420 will not be repeated.

The analog-digital conversion unit 430 may generate a first digital signal DS1 corresponding to an effective physical quantity among the measured physical quantity by performing a digital CDS operation on the first analog signal AS1 and the second analog signal AS2 received from the detection unit 410. The analog-digital conversion unit 430 may generate a second digital signal DS2 corresponding to the temperature by performing a digital CDS operation on the first voltage Vt1 and the second voltage Vt2. The analog-digital conversion unit 430 may include the digital CDS circuit 300 included in the temperature sensor 10 of FIG. 1. The analog-digital conversion unit 430 may generate the first digital signal DS1 and the second digital signal DS2 using the digital CDS circuit 300.

The detection unit 410 may include a plurality of detection circuits. Each of the detection circuits may generate the first analog signal AS1 and the second analog signal AS2. The first analog signal AS1 and the second analog signal AS2 generated by each detection circuit may have variations in the reset component due to a respective characteristic of each detection circuit. The detection device 400 may cancel the variations in the reset component included in the first analog signal AS1 and the second analog signal AS2 generated by each detection circuit because the detection unit 410 generates the first analog signal AS1 corresponding to the reset component and the second analog signal AS2 corresponding to a respective measured physical quantity, and the analog-digital conversion unit 430 generates the first digital signal DS1 corresponding to the difference between the first analog signal AS1 and the second analog signal AS2 by performing a digital CDS operation on the first analog signal AS1 and the second analog signal AS2. Therefore, one or more embodiments provide a detection device, e.g., 400, such that the first digital signal DS1 represents the effective physical quantity among the measured physical quantity.

As described above, the first voltage Vt1 and the second voltage Vt2 generated by the temperature sensing unit 420 may be not linearly proportional to the temperature since transistors included in the temperature sensing unit 420 have intrinsic nonlinear characteristics. In one or more embodiments, the detection device 400 may cancel the intrinsic nonlinear characteristics of the transistors included in the temperature sensing unit 420 since the analog-digital conversion unit 430 generates the second digital signal DS2 corresponding to the difference between the first voltage Vt1 and the second voltage Vt2 by performing a digital CDS operation on the first voltage Vt1 and the second voltage Vt2. One or more embodiments provide a detection device, e.g. 400, employing a second digital signal DS2 that is linearly proportional to the temperature, such that the temperature may be determined accurately using the second digital signal DS2.

The digital signal processor 440 may adjust the first digital signal DS1 based on the second digital signal DS2. For example, the digital signal processor 440 may increase the first digital signal DS1 when the second digital signal DS2 is relatively small, and the digital signal processor 440 may decrease the first digital signal DS1 when the second digital signal DS2 is relatively large.

As described above, the detection device 400 may have a uniform performance regardless of temperature change since the detection device 400 is configured to accurately detect temperature and to calibrate a change of temperature by adjusting the first digital signal DS1, which represents the effective physical quantity, based on the second digital signal DS2, which represents the temperature.

The detection device 400 may be various electronic devices, e.g., a charge coupled device (CCD) image sensor, a complementary metal oxide semiconductor (CMOS) image sensor, a digital camera including an image sensor, an acoustimeter, a computing system including an acoustimeter, etc.

When the detection device 400 is an image sensor, the detection unit 410 included in the detection device 400 may be embodied as a pixel array.

Hereinafter, among various electronic devices including the temperature sensor 10, particularly an image sensor will be described in further detail.

Figure 7:
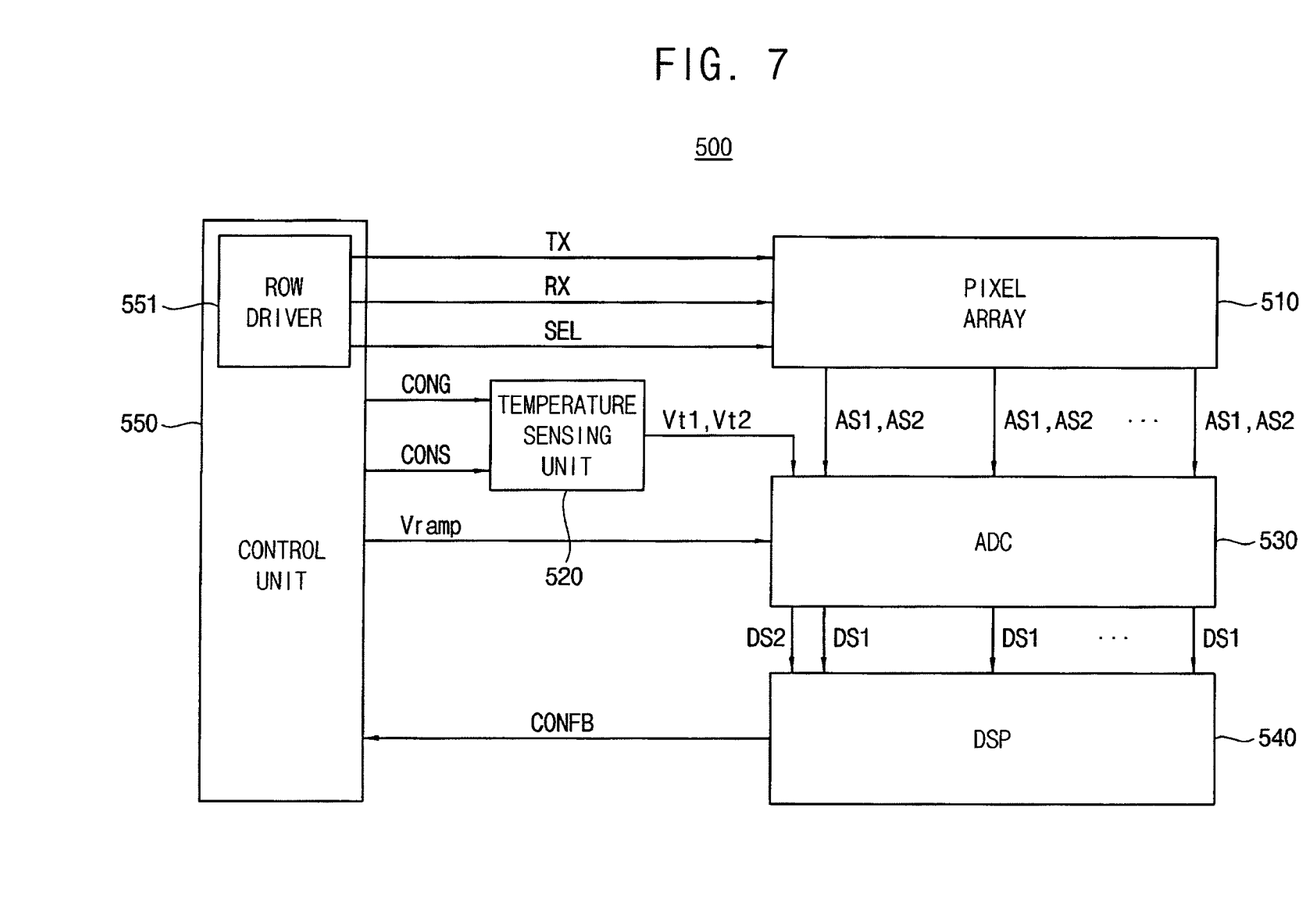
FIG. 7 illustrates a block diagram of an exemplary embodiment of an image sensor.

FIG. 7 illustrates a block diagram of an exemplary embodiment of an image sensor 500.

Referring to FIG. 7, the image sensor 500 may include a pixel array 510, a temperature sensing unit 520, an analog-digital conversion unit (ADC) 530, and a digital signal processor (DSP) 540. The image sensor 500 may further include a control unit 550.

As illustrated in FIG. 7, the detection unit 410 of the detection device 400 may be embodied as the pixel array 510 in the image sensor 500.

The pixel array 510 may reset itself and generate a first analog signal AS1 corresponding to a reset component. The pixel array 510 may measure an intensity of incident light and may generate a second analog signal AS2 corresponding to the measured intensity of incident light.

In a field of image apparatuses, image sensors of a CCD type or a CMOS type are widely used for capturing an image by sensing incident lights. The image sensor 500 of FIG. 7 may be, e.g., a CCD image sensor, a CMOS image sensor, etc.

In an example of the CMOS image sensor, the pixel array 510 may include a plurality of pixels arranged in rows and columns for converting incident lights into electrical analog signals.

The analog signals output from the pixel array 510 have variations in a reset component due to respective characteristic of each pixel referred to as a fixed pattern noise (FPN) and respective characteristic of each logic circuit for outputting a voltage signal from a corresponding pixel. Accordingly an effective intensity of incident light should be abstracted by subtracting the respective reset component from the measured intensity of incident light. For this reason, each pixel included in the pixel array 510 may generate the first analog signal AS1 corresponding to a respective reset component, and measure the intensity of incident light to generate the second analog signal AS2 corresponding to a respective measured intensity of incident light.

In the image sensor including unit cells referred to as active pixels or gain cells, respective signal from each pixel is detected by an address control of the pixels. The active pixel sensor is a kind of address-controlled image sensor. The control unit 550 may include a row driver 551 for controlling operation of the pixel array 510 by unit of a row. For example, the row driver 551 may provide a row selection signal SEL, a reset control signal RX and a transmission control signal TX to the pixel array 510 for controlling operation of the pixel array 510 by unit of a row.

Figure 8:
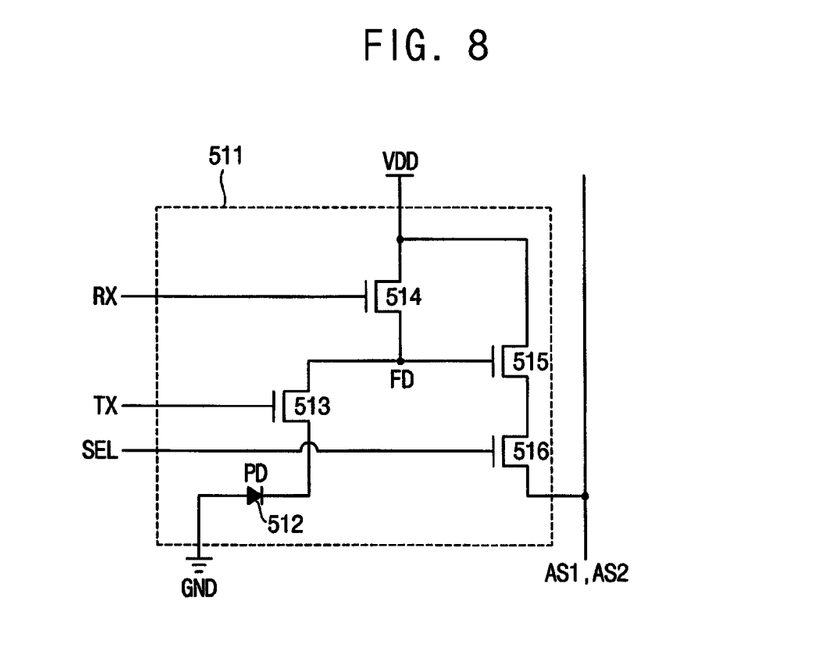
FIG. 8 illustrates a circuit diagram of an exemplary embodiment of a unit pixel employable in a pixel array of FIG. 7.

FIG. 8 illustrates a circuit diagram of an exemplary embodiment of a unit pixel 511 employable in a pixel array 510 of FIG. 7. Referring to FIG. 8, the unit pixel 511 may include a photo diode PD 512, a transmission transistor 513, a reset transistor 514, a sensing transistor 515, and a row selection transistor 516.

Hereinafter, exemplary operation of the pixel array 510 will be described with reference to FIGS. 7 and 8.

The row driver 551 may select one of a plurality of rows included in the pixel array 510 by providing an activated row selection signal SEL to the selected row of the pixel array 510 to turn on the row selection transistor 516. The row driver 551 may provide an activated reset control signal RX to the selected row to turn on the reset transistor 514. Therefore, a voltage of a node FD may be the supply voltage VDD, so that the sensing transistor 515 may be turned on to output the first analog signal AS1 corresponding to the voltage of the node FD.

After that, the row driver 551 may deactivate the reset control signal RX. When light is incident on the photo diode 512, the photo diode 512 may generate electron-hole pairs (EHPs). The generated EHPs may be accumulated at a source node of the transmission transistor 513 so that a potential of the source node of the transmission transistor 513 may be changed. The row driver 551 may provide an activated transmission control signal TX to the transmission transistor 513 to turn on the transmission transistor 513, and then the accumulated EHPs may be transferred to the node FD. When the voltage of the transmission control signal TX in an activated state is relatively high, the number of EHPs transferred to the node FD may increase, and when the voltage of the transmission control signal TX in an activated state is relatively low, the number of EHPs transferred to the node FD may decrease. Therefore, the number of EHPs transferred to the node FD may be adjusted by controlling a voltage of the transmission control signal TX in an activated state. The voltage of the node FD, which is a voltage of a gate of the sensing transistor 515, may be changed in response to the number of EHPs transferred to the node FD. If the row selection transistor 516 is turned on, the second analog signal AS2 corresponding to the voltage of the node FD may be output from the unit pixel 511.

After that, the row driver 551 may activate the reset control signal RX again to turn on the reset transistor 514 so that the voltage of the node FD may be the supply voltage VDD.

The pixel array 510 may repeat above described operations to generate the first analog signal AS1 and the second analog signal AS2 row by row.

Referring again to FIG. 7, the temperature sensing unit 520 may generate a first voltage Vt1 and a second voltage Vt2 proportional to a temperature of the image sensor 500. The temperature sensing unit 520 may be embodied using the band gap reference circuit 100 and the voltage generation unit 200 included in the temperature sensor 10 of FIG. 1. A structure and an operation of the band gap reference circuit 100 and the voltage generation unit 200 are described above with reference to FIGS. 1, 2, 3, 4, 5A, 5B, 5C, 5D, 5E, 5F, 5G and 5H. Therefore, a detailed description of the temperature sensing unit 520 will not be repeated.

The control unit 550 may provide the gain control signal CONG to the temperature sensing unit 520 for adjusting the magnitude of the first voltage Vt1 and the magnitude of the second voltage Vt2. As will be described below, the analog-digital conversion unit 530 may generate the first digital signal DS1 and the second digital signal DS2 using the same digital CDS circuit 300. Therefore, the control unit 550 may control the gain control signal CONG so that the temperature sensing unit 520 may generate the first voltage Vt1 and the second voltage Vt2 having a magnitude similar to a magnitude of the first analog signal AS1 and the second analog signal AS2. The control unit 550 may provide a switch control signal CONS to the temperature sensing unit 520 so that the temperature sensing unit 520 may control timings for outputting the first voltage Vt1 and the magnitude of the second voltage Vt2 in response to the switch control signal CONS.

The analog-digital conversion unit 530 receives the first analog signal AS1 and the second analog signal AS2 from each pixel corresponding to the selected row and generates a first digital signal DS1 corresponding to an effective intensity of incident light among the measured intensity of incident light by performing a digital CDS operation on the first analog signal AS1 and the second analog signal AS2. The analog-digital conversion unit 530 generates a second digital signal DS2 corresponding to the temperature by performing a digital CDS operation on the first voltage Vt1 and the second voltage Vt2 received from the temperature sensing unit 520. The analog-digital conversion unit 530 may include the digital CDS circuit 300 included in the temperature sensor 10 of FIG. 1. The analog-digital conversion unit 530 may generate the first digital signal DS1 and the second digital signal DS2 using the digital CDS circuit 300.

The control unit 550 may provide a ramp signal Vramp to the analog-digital conversion unit 530. The digital CDS circuit 300 included in the analog-digital conversion unit 530 may convert the first analog signal AS1, the second analog signal AS2, the first voltage Vt1 and the second voltage Vt2 to digital signals by comparing the first analog signal AS1, the second analog signal AS2, the first voltage Vt1 and the second voltage Vt2 with the ramp signal Vramp. When a magnitude of the ramp signal Vramp is relatively high, a digital signal generated by the digital CDS circuit 300 for a same analog signal decreases, and when a magnitude of the ramp signal Vramp is relatively low, a digital signal generated by the digital CDS circuit 300 for a same analog signal increases.

The digital signal processor 540 adjusts the first digital signal DS1 based on the second digital signal DS2. For example, the digital signal processor 540 may increase the first digital signal DS1 when the second digital signal DS2 is relatively small, and the digital signal processor 540 may decrease the first digital signal DS1 when the second digital signal DS2 is relatively large. The digital signal processor 540 may provide a feedback control signal CONFB to the control unit 550 based on the second digital signal DS2. An operation of the control unit 550 based on the feedback control signal CONFB will be described later.

Figure 9:
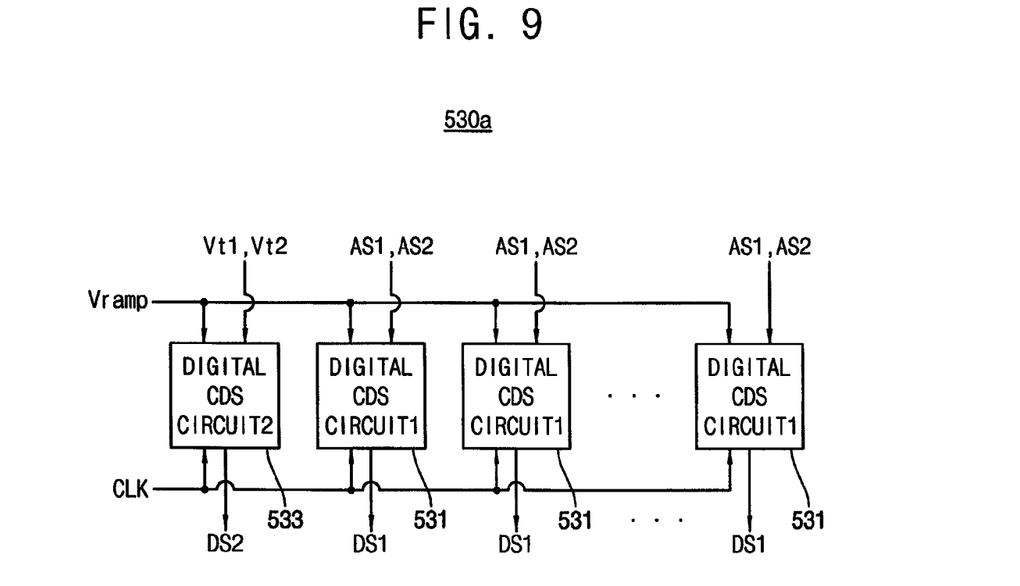
FIG. 9 illustrates a block diagram of exemplary embodiment of an analog-digital conversion unit employable in the image sensor of FIG. 7.

FIG. 9 illustrates a block diagram of an exemplary embodiment of an analog-digital conversion unit 530*a* employable in the image sensor 500 of FIG. 7.

Referring to FIG. 9, the analog-digital conversion unit 530*a* may include a plurality of first digital CDS circuits 531, and a second digital CDS circuit 533.

A number of the plurality of the first digital CDS circuits 531 may be the same as the number of the columns included in the pixel array 510. Each of the plurality of the first digital CDS circuits 531 may be respectively coupled to a column of the pixel array 510, respectively. Each of the plurality of the first digital CDS circuits 531 may receive the first analog signal AS1 and the second analog signal AS2 from a unit pixel of a row selected by the row driver 551, and may generate the first digital signal DS1 corresponding to a difference between the first analog signal AS1 and the second analog signal AS2 by performing a digital CDS operation on the first analog signal AS1 and the second analog signal AS2 using the ramp signal Vramp received from the control unit 550.

The second digital CDS circuit 533 may be coupled to the temperature sensing unit 520, and may receive the first voltage Vt1 and the second voltage Vt2 from the temperature sensing unit 520. The second digital CDS circuit 533 may generate the second digital signal DS2 corresponding to a difference between the first voltage Vt1 and the second voltage Vt2 by performing a digital CDS operation on the first voltage Vt1 and the second voltage Vt2 using the ramp signal Vramp received from the control unit 550.

The plurality of the first digital CDS circuits 531 and the second digital CDS circuit 533 may have the same structure. For example, the plurality of the first digital CDS circuits 531 and the second digital CDS circuit 533 may correspond to the digital CDS circuit 300 included in the temperature sensor 10 of FIG. 1.

Referring to FIGS. 7 and 9, the control unit 550 may provide the activated reset control signal RX to the pixel array 510 and may provide the switch control signal CONS having a first value to the temperature sensing unit 520 simultaneously so that the pixel array 510 may provide the first analog signal AS1 to the analog-digital conversion unit 530*a* and the temperature sensing unit 520 may output the first voltage Vt1 to the analog-digital conversion unit 530*a* simultaneously. The control unit 550 may provide the deactivated reset control signal RX and the activated transmission control signal TX to the pixel array 510 and may provide the switch control signal CONS having a second value to the temperature sensing unit 520 simultaneously so that the pixel array 510 may provide the second analog signal AS2 to the analog-digital conversion unit 530*a* and the temperature sensing unit 520 may output the second voltage Vt2 to the analog-digital conversion unit 530*a* simultaneously.

As illustrated in FIG. 9, the plurality of the first digital CDS circuits 531 and the second digital CDS circuit 533 may operate in synchronization with a same clock signal CLK. The clock signal CLK may be provided from the control unit 550. Therefore, the analog-digital conversion unit 530*a* may generate the first digital signals DS1 corresponding to pixels included in the selected row of the pixel array 510 and the second digital signal DS2 corresponding to the temperature simultaneously.

The analog-digital conversion unit 530*a* may output the first digital signals DS1, which are generated from the plurality of the first digital CDS circuits 531, and the second digital signal DS2, which is generated from the second digital CDS circuit 533, in series to the digital signal processor 540.

Figure 10:
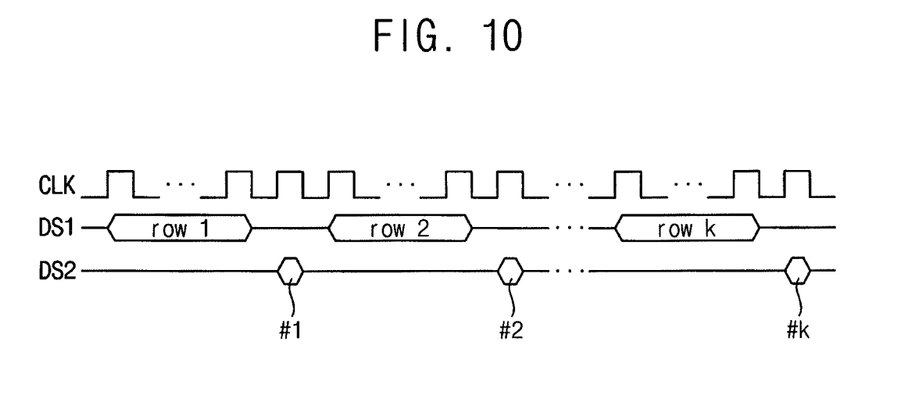
FIG. 10 illustrates a timing diagram for describing an exemplary operation of the analog-digital conversion unit of FIG. 9.

FIG. 10 illustrates a timing diagram for describing an exemplary operation of the analog-digital conversion unit 530*a* of FIG. 9.

Referring to FIG. 10, the analog-digital conversion unit 530*a* may generate the first digital signals DS1 corresponding to pixels included in a first row of the pixel array 510 and the second digital signal DS2 corresponding to the temperature simultaneously, and may then output the first digital signals DS1 in series (row1 in FIG. 10) and the second digital signal DS2 (#1 in FIG. 10) consecutively. After that, the analog-digital conversion unit 530a may generate the first digital signals DS1 corresponding to pixels included in a second row of the pixel array 510 and the second digital signal DS2 corresponding to the temperature simultaneously, and may then output the first digital signals DS1 in series (row2 in FIG. 10) and the second digital signal DS2 (#2 in FIG. 10) consecutively. The analog-digital conversion unit 530a may repeat the above described operation until k-th row of the pixel array 510, where k represents the number of rows included in the pixel array 510.

In the exemplary embodiment of FIG. 10, the first digital signals DS1 are output in series before the second digital signal DS2 may be output. In one or more other embodiments, the second digital signal DS2 may be output first and then the first digital signals DS1 may be output in series.

The digital signal processor 540 may adjust the first digital signals DS1 based on the second digital signal DS2 simultaneously generated with the first digital signals DS1 by the analog-digital conversion unit 530a. For example, in FIG. 10, the digital signal processor 540 may adjust the first digital signals DS1 (row1 in FIG. 10) based on the second digital signal DS2 (#1 in FIG. 10), may adjust the first digital signals DS1 (row2 in FIG. 10) based on the second digital signal DS2 (#2 in FIG. 10), and may adjust the first digital signals DS1 (row k in FIG. 10) based on the second digital signal DS2 (#k in FIG. 10).

Figure 11:
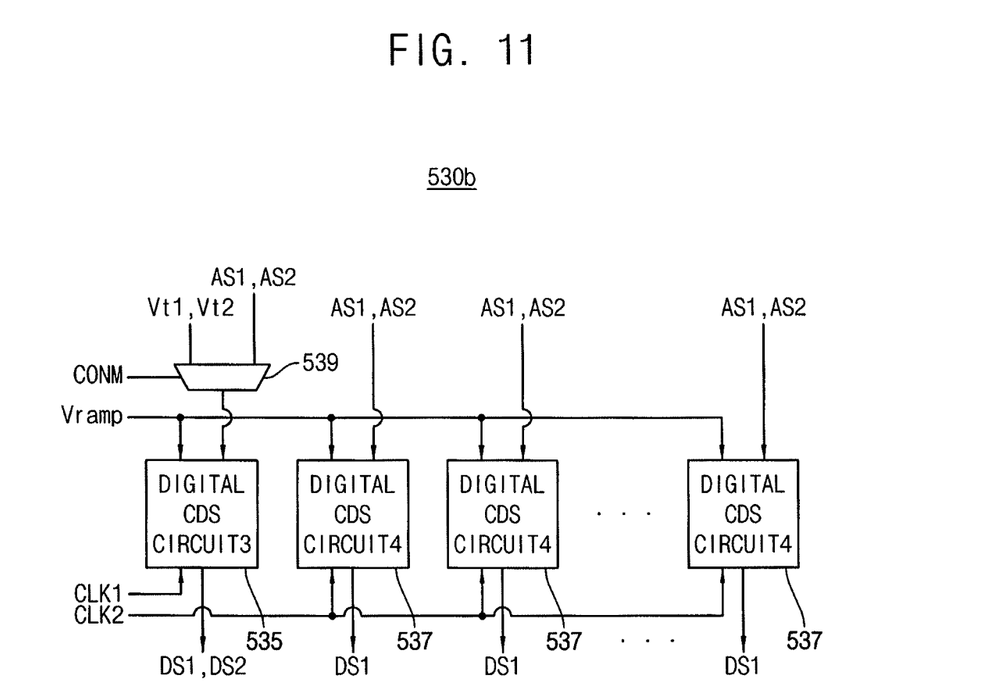
FIG. 11 illustrates a block diagram of another exemplary embodiment of an analog-digital conversion unit employable in the image sensor of FIG. 7.

FIG. 11 illustrates a block diagram of another exemplary embodiment of an analog-digital conversion unit 530b employable in the image sensor 500 of FIG. 7.

Referring to FIG. 11, the analog-digital conversion unit 530b may include a third digital CDS circuit 535, a plurality of fourth digital CDS circuits 537, and a multiplexer 539.

The third digital CDS circuit 535 may be coupled to both a first column of the pixel array 510 and the temperature sensing unit 520 through the multiplexer 539. The first column may be an arbitrary column included in the pixel array 510. A first input electrode of the multiplexer 539 may be coupled to the first column of the pixel array 510 and may receive the first analog signal AS1 and the second analog signal AS2 from the first column of the pixel array 510. A second input electrode of the multiplexer 539 may be coupled to the temperature sensing unit 520 and receive the first voltage Vt1 and the second voltage Vt2 from the temperature sensing unit 520. The multiplexer 539 may provide the first analog signal AS1 and the second analog signal AS2 received from the first input electrode to the third digital CDS circuit 535 in a first operation mode, and output the first voltage Vt1 and the second voltage Vt2 received from the second input electrode to the third digital CDS circuit 535 in a second operation mode. The operation mode may be determined by a mode control signal CONM. The mode control signal CONM may be provided from the control unit 550.

A number of the plurality of the fourth digital CDS circuits 537 may be smaller, e.g., by one, than the number of the columns included in the pixel array 510. Each of the plurality of the fourth digital CDS circuits 537 may be coupled to each column of the pixel array 510 except for the first column, respectively.

In a first operation mode, the third digital CDS circuit 535 and each of the plurality of the fourth digital CDS circuits 537 may receive the first analog signal AS1 and the second analog signal AS2 from the pixel array 510, and may generate the first digital signal DS1 corresponding to a difference between the first analog signal AS1 and the second analog signal AS2 by performing a digital CDS operation on the first analog signal AS1 and the second analog signal AS2 using the ramp signal Vramp received from the control unit 550.

In a second operation mode, the third digital CDS circuit 535 may receive the first voltage Vt1 and the second voltage Vt2 from the temperature sensing unit 520, and may generate the second digital signal DS2 corresponding to a difference between the first voltage Vt1 and the second voltage Vt2 by performing a digital CDS operation on the first voltage Vt1 and the second voltage Vt2 using the ramp signal Vramp received from the control unit 550.

The third digital CDS circuit 535 and the plurality of the fourth digital CDS circuits 537 may have the same structure. For example, the third digital CDS circuit 535 and the plurality of the fourth digital CDS circuits 537 may be the digital CDS circuit 300 included in the temperature sensor 10 of FIG. 1.

The analog-digital conversion unit 530b may output the first digital signals DS1 corresponding to all rows of the pixel array 510 (that is, corresponding to a frame) in the first operation mode, and may operate in the second operation mode during an interval between frames to output the second digital signal DS2.

The control unit 550 may provide the mode control signal CONM having a first value to the analog-digital conversion unit 530b during a frame period so that the analog-digital conversion unit 530b may output the first digital signals DS1 corresponding to all rows of the pixel array 510 (that is, corresponding to a frame) in the first operation mode. The control unit 550 may provide the mode control signal CONM having a second value to the analog-digital conversion unit 530b during an interval between frames so that the analog-digital conversion unit 530b may output the second digital signal DS2 in the second operation mode.

As illustrated in FIG. 11, the third digital CDS circuit 535 may operate in synchronization with a first clock signal CLK1, and the plurality of the fourth digital CDS circuits 537 may operate in synchronization with a second clock signal CLK2. The first clock signal CLK1 may toggle both in the first operation mode and the second operation mode, and the second clock signal CLK2 may toggle in the first operation mode and stop toggling in the second operation mode. The first clock signal CLK1 and the second clock signal CLK2 may be provided from the control unit 550. Therefore, the analog-digital conversion unit 530b may generate the first digital signals DS1 corresponding to all rows of the pixel array 510 (that is, corresponding to a frame) in the first operation mode and may generate the second digital signal DS2 corresponding to the temperature in the second operation mode.

The analog-digital conversion unit 530b may output the first digital signals DS1 and the second digital signal DS2 in series to the digital signal processor 540.

Figure 12:
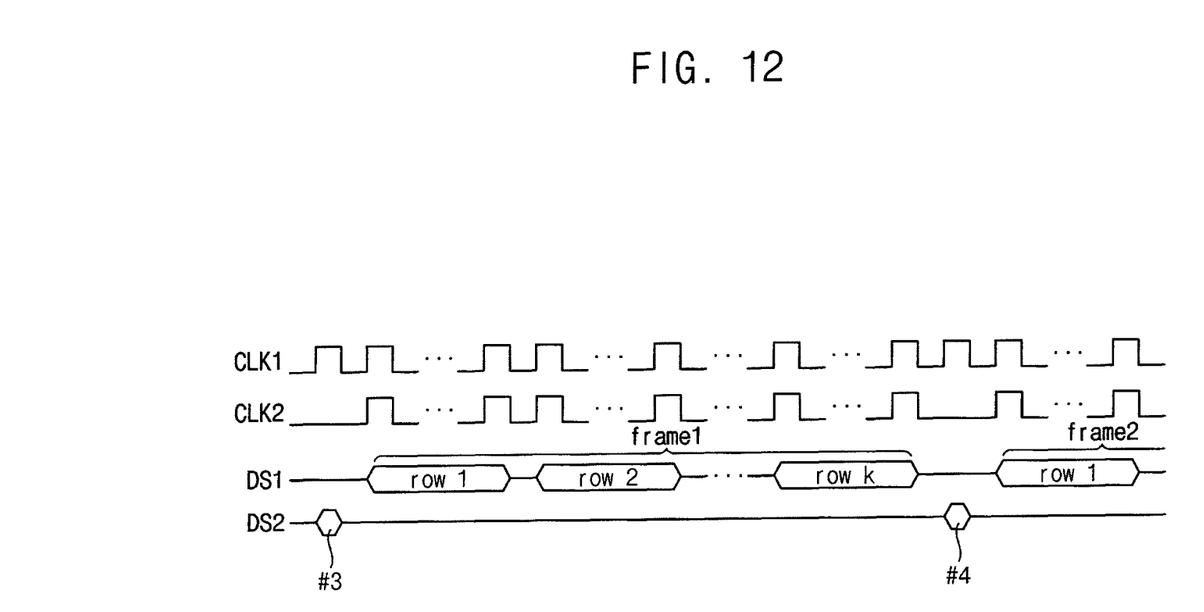
FIG. 12 illustrates a timing diagram for describing an exemplary operation of the analog-digital conversion unit of FIG. 11.

FIG. 12 illustrates a timing diagram for describing an exemplary operation of the analog-digital conversion unit 530b of FIG. 11.

Referring to FIG. 12, the analog-digital conversion unit 530a may output the second digital signal DS2 corresponding to the temperature in the second operation mode during an interval between frames (#3 in FIG. 12), and may then output the first digital signals DS1 corresponding to a first frame including all rows (that is, from a first row to a k-th row) of the pixel array 510 (frame1 in FIG. 12) in the first operation mode. After that, the analog-digital conversion unit 530b may output the second digital signal DS2 corresponding to the temperature in the second operation mode during an interval between frames (#4 in FIG. 12), and may then output the first digital signals DS1 corresponding to a second frame including all rows (that is, from a first row to a k-th row) of the pixel array 510 (frame2 in FIG. 12) in the first operation mode. The analog-digital conversion unit 530b may repeat the above described operation.

The digital signal processor 540 may adjust the first digital signals DS1 corresponding to a frame based on the second digital signal DS2 generated right before the first digital signals DS1. For example, in FIG. 12, the digital signal processor 540 may adjust the first digital signals DS1 (frame1 in FIG. 12) based on the second digital signal DS2 (#3 in FIG. 12) and may adjust the first digital signals DS1 (frame2 in FIG. 12) based on the second digital signal DS2 (#4 in FIG. 12). In one or more other embodiments, the first digital signals DS1 corresponding to a frame may be adjusted based on the second digital signal DS2 generated right after the first digital signals DS1.

The digital signal processor 540 may include a look-up table for matching the second digital signal DS2 with temperature.

Figure 13:
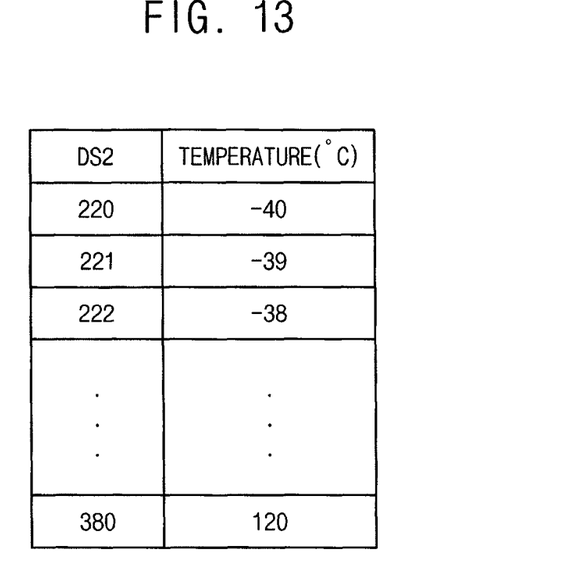
FIG. 13 illustrates a table as an exemplary embodiment of a look-up table employable by the digital signal processor of FIG. 7.

FIG. 13 illustrates a table as an exemplary embodiment of a look-up table employable by the digital signal processor of FIG. 7.

Referring to FIG. 13, the look-up table may include the second digital signal DS2 in relation with the temperature. The look-up table may be acquired by a simulation or a pre-test on the image sensor 500. In one or more embodiments, the digital signal processor 540 may determine the temperature of the image sensor 500 easily by reading a temperature corresponding to a value of the second digital signal DS2 from the look-up table.

The digital signal processor 540 may adjust the first digital signal DS1 based on the temperature that is read from the look-up table. For example, the digital signal processor 540 may decrease the first digital signal DS1 when the read temperature is relatively high, and the digital signal processor 540 may increase the first digital signal DS1 when the read temperature is relatively low.

The digital signal processor 540 may provide the feedback control signal CONFB to the control unit 550 based on the read temperature. For example, the digital signal processor 540 may provide the feedback control signal CONFB that is proportional to the read temperature.

The control unit 550 may adjust the voltage of the transmission control signal TX in an activated state based on the feedback control signal CONFB. As described above with reference to FIG. 8, when the voltage of the transmission control signal TX in an activated state is relatively high, the number of EHPs transferred to the node FD may increase, and when the voltage of the transmission control signal TX in an activated state is relatively low, the number of EHPs transferred to the node FD may decrease. The control unit 550 may adjust the voltage of the transmission control signal TX in an activated state to be inversely proportional to the temperature since the number of EHPs generated by the photo diode PD 512 increases as the temperature increases. For example, if the feedback control signal CONFB is proportional to the read temperature, the control unit 550 may adjust the voltage of the transmission control signal TX in an activated state to be inversely proportional to the feedback control signal CONFB. Therefore, the image sensor 500 may output a constant first digital signal DS1 for the same incident light regardless of temperature change.

The control unit 550 may adjust the magnitude of the ramp signal Vramp, which is provided to the analog-digital conversion unit 530, based on the feedback control signal CONFB. As described above with reference to FIG. 7, when the magnitude of the ramp signal Vramp is relatively high, a digital signal generated by the analog-digital conversion unit 530 for a same analog signal decreases, and when the magnitude of the ramp signal Vramp is relatively low, a digital signal generated by the analog-digital conversion unit 530 for a same analog signal increases. Therefore, the control unit 550 may adjust the magnitude of the ramp signal Vramp to be proportional to the temperature. For example, if the feedback control signal CONFB is proportional to the read temperature, the control unit 550 may adjust the magnitude of the ramp signal Vramp to be proportional to the feedback control signal CONFB. Therefore, the image sensor 500 may output a constant first digital signal DS1 for the same incident light regardless of temperature change.

As described above, the image sensor 500 according to exemplary embodiments may have a uniform performance regardless of temperature change since the image sensor 500 may accurately detect temperature and calibrate a change of temperature by adjusting the first digital signal DS1, which represents the effective intensity of incident light, based on the second digital signal DS2, which represents the temperature.

Figure 14:
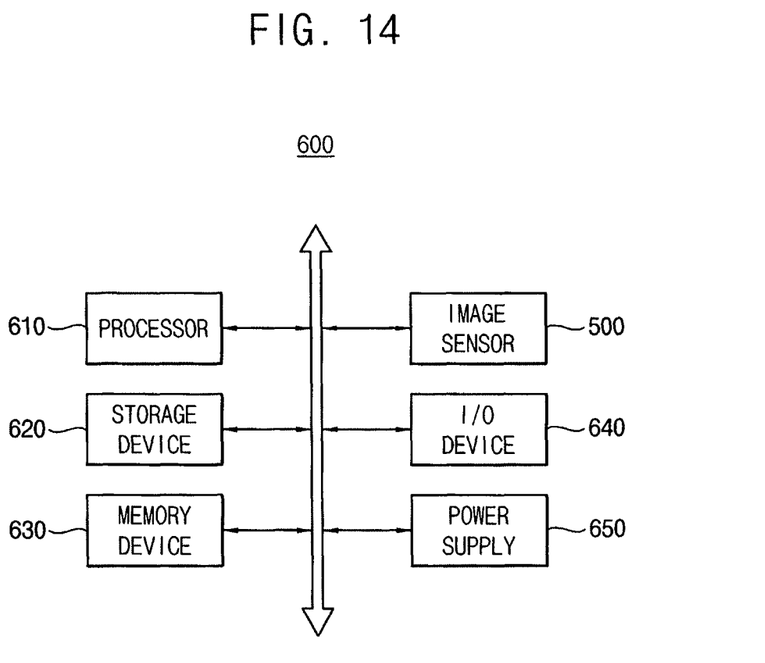
FIG. 14 illustrates a block diagram of an exemplary embodiment of an image sensing system.

FIG. 14 illustrates a block diagram of an exemplary embodiment of an image sensing system 600.

Referring to FIG. 14, the image sensing system 600 may include an image sensor 500, a processor 610 and a storage device 620.

The image sensor 500 may detect incident lights and may convert the incident lights into a digital signal. The storage device 620 may store the digital signal generated from the image sensor 500. The processor 610 may control operations of the image sensor 500 and the storage device 620.

The image sensing system 600 may further include a memory device 630, an input/output device 640 and a power supply 650. Although not illustrated in FIG. 14, the image sensing system 600 may further include ports to communicate with a video card, a sound card, a memory card, a universal serial bus (USB) device, etc.

The processor 610 may perform various computing functions, such as executing specific software for performing specific calculations or tasks. For example, the processor 610 may be a microprocessor, a central process unit, etc. The processor 610 may be connected to the storage device 620, the memory device 630 and the input/output device 640 via a bus such as an address bus, a control bus or a data bus, etc. The processor 610 may be connected to an extended bus, such as peripheral component interconnect (PCI) bus.

The storage device 620 may include a solid state drive, a hard disk drive, a compact disk read-only memory (CD-ROM) drive, etc.

The memory device 630 may be a dynamic random access memory (DRAM), a static random access memory (SRAM), or a non-volatile memory, such as an erasable programmable read-only memory (EPROM), an electrically erasable programmable read-only memory (EEPROM), a flash memory, etc.

The input/output device 640 may include a keyboard, a mouse, a printer, a display device, etc. The power supply 650 may supply operational power.

The image sensor 500 may communicate with the processor 610 via a bus. The image sensor 500 may be the image sensor of FIG. 7. A structure and an operation of the image sensor 500 are described above with reference to FIGS. 7, 8, 9, 10, 11, 12 and 13. Therefore, a detail description of the image sensor 500 will not be repeated.

In one or more embodiments, the image sensor 500 may be integrated in a chip with the processor 610. In one or more other embodiments, the image sensor 500 and the processor 610 may be integrated in separate chips. The image sensing system 600 may be arbitrary systems that include the image sensor 500, such as a digital camera, a camcorder, etc.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An image sensor, comprising:
    a detection unit configured to generate a first analog signal corresponding to a reset component after reset, and configured to measure an intensity of incident light to generate a second analog signal corresponding to the measured intensity of incident light;
    a temperature sensing unit configured to generate a first voltage and a second voltage proportional to a temperature;
    an analog-digital conversion unit configured to generate a first digital signal corresponding to an effective intensity of incident light among the measured intensity of incident light by performing a digital CDS operation on the first analog signal and the second analog signal, and configured to generate a second digital signal corresponding to the temperature by performing a digital CDS operation on the first voltage and the second voltage; and
    a digital signal processor (DSP) configured to adjust the first digital signal based on the second digital signal, wherein
    the temperature sensing unit adjusts a magnitude of the first voltage and a magnitude of the second voltage in a same ratio based on a gain control signal.

2. The image sensor as claimed in claim 1, wherein the detection unit includes a pixel array having a plurality of pixels arranged in rows and columns, each pixel generating the first analog signal corresponding to a respective reset component and measuring the intensity of incident light to generate the second analog signal corresponding to a respective measured intensity of incident light.

3. The image sensor as claimed in claim 2, wherein the analog-digital conversion unit generates the first digital signals corresponding to a row of the pixel array and the second digital signal simultaneously.

4. The image sensor as claimed in claim 3, wherein the analog-digital conversion unit includes:
    a plurality of first digital CDS circuits coupled to columns of the pixel array, respectively, each of the plurality of the first digital CDS circuits generating the first digital signal by performing a digital CDS operation on the first analog signal and the second analog signal; and
    a second digital CDS circuit coupled to the temperature sensing unit, the second digital CDS circuit generating the second digital signal by performing a digital CDS operation on the first voltage and the second voltage.

5. The image sensor as claimed in claim 2, wherein the analog-digital conversion unit generates the first digital signals corresponding to all rows of the pixel array in a first operation mode, and generates the second digital signal in a second operation mode.

6. The image sensor as claimed in claim 5, wherein the analog-digital conversion unit includes:
    a first digital CDS circuit coupled to both a first column of the pixel array and the temperature sensing unit; and
    a plurality of second digital CDS circuits coupled to columns except for the first column of the pixel array, respectively,
    wherein the first digital CDS circuit and each of the plurality of the second digital CDS circuits generate the first digital signal by performing a digital CDS operation on the first analog signal and the second analog signal in the first operation mode, and the first digital CDS circuit generates the second digital signal by performing a digital CDS operation on the first voltage and the second voltage in the second operation mode.

7. The image sensor as claimed in claim 2, wherein the digital signal processor includes a look-up table for matching the second digital signal with temperature, and reads a temperature corresponding to a value of the second digital signal from the look-up table.

8. The image sensor as claimed in claim 7, wherein the digital signal processor adjusts the first digital signal based on the read temperature.

9. The image sensor as claimed in claim 7, further comprising:
    a control unit configured to provide a ramp signal, which is used by the analog-digital conversion unit for performing a digital CDS operation on the first analog signal and the second analog signal to generate the first digital signal, to the analog-digital conversion unit,
    wherein the digital signal processor provides a feedback control signal to the control unit based on the read temperature and the control unit adjusts a magnitude of the ramp signal based on the feedback control signal.

10. The image sensor as claimed in claim 7, further comprising:
    a control unit configured to provide a control signal to the pixel array to control an operation of the pixel array,
    wherein the digital signal processor provides a feedback control signal to the control unit based on the read temperature and the control unit adjusts a voltage of the control signal based on the feedback control signal.

11. An image sensor, comprising:
    a detection unit configured to generate a first analog signal corresponding to a reset component after reset, and configured to measure an intensity of incident light to generate a second analog signal corresponding to the measured intensity of incident light;
    a temperature sensing unit configured to generate a first voltage and a second voltage proportional to a temperature;
    an analog-digital conversion unit configured to generate a first digital signal corresponding to an effective intensity of incident light among the measured intensity of incident light by performing a digital CDS operation on the first analog signal and the second analog signal, and configured to generate a second digital signal corresponding to the temperature by performing a digital CDS operation on the first voltage and the second voltage; and
    a digital signal processor (DSP) configured to adjust the first digital signal based on the second digital signal, wherein
    the analog-digital conversion unit generates the first digital signal and the second digital signal simultaneously.

* * * * *